United States Patent [19]

Suezawa et al.

[11] 4,378,423

[45] Mar. 29, 1983

[54] METHOD OF MAKING A DRY PLANOGRAPHIC PRINTING PLATE

[75] Inventors: Mitsuru Suezawa; Masaya Asano, both of Ohtsu, Japan

[73] Assignee: Toray Industries, Inc., Tokyo, Japan

[21] Appl. No.: 278,094

[22] Filed: Jun. 29, 1981

[30] Foreign Application Priority Data

Jun. 30, 1980 [JP] Japan .................................. 55-87795

[51] Int. Cl.³ .............................................. G03F 7/02
[52] U.S. Cl. ................................................. 430/303
[58] Field of Search ......................................... 430/303

[56] References Cited

U.S. PATENT DOCUMENTS

| | | | |
|---|---|---|---|
| 3,677,178 | 7/1972 | Gipe | 430/303 |
| 3,894,873 | 7/1975 | Kobayashi et al. | 430/303 |
| 3,953,212 | 4/1976 | Miyano et al. | 430/303 |

*Primary Examiner*—Won H. Louie, Jr.
*Attorney, Agent, or Firm*—Austin R. Miller

[57] ABSTRACT

Developing a dry planographic printing plate using a propylene oxide derivative.

6 Claims, No Drawings

METHOD OF MAKING A DRY PLANOGRAPHIC PRINTING PLATE

The present invention relates to a method of manufacturing a dry planographic printing plate, and more particularly, to an improved method of manufacturing a dry planographic printing plate composed of a silicone rubber layer overlying a photoadhesive layer.

Various dry planographic printing plates having silicone rubber layers which are ink-repellent non-image areas have already been proposed. Among them, the dry planographic printing plates disclosed, for example, in Japanese Pat. No. 1,030,979 or Japanese Laid Open Patent Application Tokkaisho No. 50-50102 are each composed of a silicone rubber layer overlying a photoadhesive layer on a base substrate. They are capable of printing tens of thousands of sheets without employment of any dampening solution. They are normally processed by exposure to light and developing.

In such procedures an unprocessed plate is exposed to actinic radiation through a positive film which is brought into vacuum contact with the plate. The exposed plate is then immersed in a developer containing or consisting of a paraffin hydrocarbon which causes the silicone rubber layer in the unexposed areas to become extremely swollen and to crumple like a washboard. When the surface of the printing plate is subsequently lightly rubbed with a soft pad the silicone rubber layer in the unexposed area is selectively rubbed off. In this way an unhardened photoadhesive underlayer is bared, which portion becomes an ink-receptive image area. On the other hand, the silicone rubber layer in the exposed area, although slightly swollen by the developer, adheres and remains bound firmly to the photopolymerized photoadhesive layer and therefore remains on the plate surface without being affected even when strongly rubbed by the developing pad. Since this portion forms an ink-repellent non-image area, a dry planographic printing plate obtained as described sometimes provides sharp dots where the silicone rubber has broken away from the photoadhesive layer.

On the contrary, when development is insufficient, the silicone rubber layer undesirably remains at the area where it should have broken off from the photoadhesive layer, thus resulting in a printing plate having poor dot reproduction. If the plate surface is too strongly rubbed during development even the silicone rubber layer which should remain on the printing plate surface as a non-image area is undesirably impaired giving rise to toning and pin holes or defects in the printed matter produced. This presents such a problem that a printing plate having excellent printability cannot be obtained.

We have now found that, by the addition of a propylene oxide derivative to the developer used in the developing process a marked improvement is obtained in the development characteristics of the plate, thus creating a printing plate having excellent dot producibility and resolution.

More specifically, according to the present invention, a method is provided for preparing a dry planographic printing plate which comprises the steps of exposing a plate having an ink-repellent silicone rubber layer to actinic radiation through a transparency and developing the exposed plate with a developer containing at least about 0.1% by weight of a propylene oxide derivative.

Generally, solvents used as developers for dry planographic printing plates having silicone rubber layers which are ink-repellent non-image areas should have the characteristic of causing the silicone rubber to swell. Solvents composed of paraffin hydrocarbons, and those mainly composed thereof, are desirable. Such solvents are readily available from fractional distillation of petroleum. In addition, refined paraffin hydrocarbons such as pentane, hexane, heptane, octane, etc. are useful solvents.

Furthermore, solutions may be employed by adding to the above solvents other components such as water, alcohols such as cyclohexanol, n-octyl alcohol, n-decyl alcohol, lauryl alcohol, 3-methyl-3-methoxybutanol, benzyl alcohol, 2,3,5-trimethyl-hexanol, etc., or esters such as diethylene glycol diacetate, diethylene glycol butylether acetate, diethylene glycol ethylether acetate, dibutyl adipate, dibutyl sebacate, diethyl sebacate, dibutyl phthalate, diethyl succinate, etc., ethers such as butyl ether, ethyl hexyl ether, diethylene glycol monoethyl ether, diethylene glycol monobutyl ether, triethylene glycol monomethyl ether, triethylene glycol dimethyl ether, etc., or carboxylic acids such as 2-ethylhexanoic acid, oleic acid, dimer acid, ricinoleic acid, etc., or aromatic hydrocarbons, alicyclic hydrocarbons, halogenated hydrocarbons, etc., in such amounts as not to dissolve even the unhardened photoadhesive layer. Emulsions of the foregoing solvents, formed with suitable emulsifying agents, or those having added dyes, may also be used.

The developer employed in the method according to the present invention may be prepared by adding at least one kind of propylene oxide derivative to a solvent or mixed solution as described above. The propylene oxide derivative must be added in an amount of at least about 0.1%, more preferably, at least about 1% by weight based on the weight of the developer into an upper limit of 100%. More preferably the amount of the propylene oxide derivative is 2 to 20% by weight.

The designation "propylene oxide derivatives" as referred to herein is intended to include propylene oxide and related compounds capable of being produced by addition reaction of propylene oxide. They are represented by the following general formula:

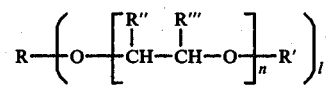

wherein n is a whole number in the range of 1 to 50 and more preferably 1 to 20, 1 is a whole number in the range of 1 to 8, R is a group selected from the group consisting of hydrogen, mono- or multi-valent alkyl groups having carbon atoms in the range of 1 to 20 and more preferably 1 to 5, mono- or multi-valent aryl or aralkyl groups having 6 to 20 carbon atoms, and acyl groups having 1 to 20, more preferably 1 to 5 carbon atoms. R' is a monovalent group selected from the group consisting of hydrogen, alkyl groups having carbon atoms in the range of 1 to 20 and more preferably 1 to 5, aryl or aralkyl groups having 6 to 20 carbon atoms, or acyl groups having 1 to 20, more preferably 1 to 5 carbon atoms. These groups may be replaced by substances such as hydroxyl group, halogen, etc. to the extent that they do not adversely affect the plate material. Meanwhile, in the range less than about 50 mol%, an ethylene oxide chain may be copolymerized with the propylene oxide chain. R″ and R‴ are different groups selected from the group consisting of hydrogen and methyl.

As specific examples of propylene oxide derivatives which are employable, there may be cited propylene glycol, dipropylene glycol, tripropylene glycol, polypropylene glycol, propylene oxide-ethylene oxide copolymers, monovalent alcohol propylene oxide addition products (for example the alcohols may be methanol, propanol, butanol, etc.), monovalent alcohol propylene oxide-ethylene oxide addition products, polyvalent alcohols (for example, glycerin, trimethylolpropane, etc.) propylene oxide addition products, carboxylic acid propylene oxide addition products, alkylphenol propylene oxide addition products, etc.

Among the above, particularly useful substances include polypropylene glycol, dipropylene glycol monomethyl ether, tripropylene glycol monomethyl ether, dipropylene glycol monobutyl ether, tripropylene glycol monobutyl ether having an average molecular weight in the range of about 100 to 1000 (preferably about 150 to 600), propylene oxide-ethylene oxide copolymers having average molecular weights in the range of about 150 to 2,000 and monobutyl ethers thereof.

Dry planographic printing plates to which this invention is particularly applicable are dry planographic printing plates having silicone rubber layers which are ink-repellent non-image areas, and more preferably, positive-acting dry planographic printing plates having silicone rubber layers overlying photoadhesive layers on a base substrate.

The portions of this description which follow will relate to the positive-acting dry planographic printing plates to which the invention is preferably applicable.

The base substrate for the planographic printing plate should be sufficiently flexible that it can be mounted on a lithographic press and strong enough that it can withstand the stress normally produced by the lithographic printing process. Representative base substrates may include coated paper, metallic plates or plastic films such as polyethylene terephthalate, etc. It is useful to provide a layer for preventing halation on such base substrates.

The photoadhesive layer has such characteristics that it polymerizes and binds the overlying silicone rubber layer when exposed to actinic radiation.

The thickness of the photoadhesive layer may be selected as desired, provided the layer is uniformly applied onto the base substrate and closely adheres thereto. However, it should preferably be less than about 100 microns, and a thickness less than about 50 microns is even more useful for the purpose. If required, it is also useful to provide an anchor coating layer between the base substrate and the photoadhesive layer for improvement of adhesiveness or prevention of undesirable halation.

The photoadhesive layer as described above may be provided with compositions as shown below:
(1) At least one kind of photopolymerizable unsaturated monomer or oligomer having a boiling point above 100° C.—1.0~99.9 parts by weight.
(2) A photoinitiator—0.1~20.0 parts by weight.
(3) A heat polymerization inhibitor, as occasion demands—0.1~10 parts by weight.
(4) A polymer or inorganic powder as filler for maintaining the dimensional stability of the photoadhesive layer, as occasion demands—0.01~95.0 parts by weight.

As representative examples of the photopolymerizable monomer or oligomer, there may be cited methacrylic ester or methacrylamide having a boiling point higher than 100° C. and derived from a monovalent alcohol or monovalent amine having less than 30 carbon atoms, and methacrylic ester or methacrylamide having a boiling point higher than 100° C. and derived from a polyvalent alcohol or a polyvalent amine having less than 80 carbon atoms.

The representative examples of photoinitiators include benzophenone, xanthone, benzoin methyl ether, dibenzyl disulfide, uranyl nitrate, etc., while as representative examples of the heat polymerization inhibitor, hydroquinone, phenothiazine, 2,4-dinitrophenol, triphenylmethan, etc. may be cited. As fillers polymers such as polymethacrylic ester, polyurethane, polyamide, polyester, etc., and inorganic powders such as colloidal silica, calcium carbonate, etc. are useful.

The silicone rubber layer has a thickness in the range of about 0.5 to 50 microns, preferably about 0.5 to 5 microns, and is thin enough to provide effective transparency allowing actinic radiation to pass therethrough. Silicone rubbers suitable for use are linear diorganopolysiloxanes (more preferably, dimethylpolysiloxanes) having molecular weights of about 100 to 100,000 which are crosslinked by condensation of the end groups with crosslinking agents and with catalysts added as occasion demands. The silicone rubber layer has an ink-repellency, while the surface thereof is somewhat tacky and readily subjected to adhesion of dust and dirt, thus tending to invite such problems as difficulty in achieving sufficiently close contact of the positive film in the exposing process, and therefore, a thin transparent protective film may be applied to the surface of the silicone rubber layer. Meanwhile, this protective film also plays a part in suppressing the penetration of oxygen from the air into the photoadhesive layer so as to promote photopolymerization. As described above, although the protective film is useful in the exposing process, it is of course removed in the developing process by peeling if off or dissolving it, and it is not required in the printing process. Useful protective films have sufficient transparency to permit actinic radiation to pass therethrough and have a thickness less than about 100 microns and more preferably, less than about 10 microns. As representative examples of such protective films there may be cited plastic films such as polyethylene, polypropylene, polyvinyl chloride, polyvinylidene chloride, polyvinyl alcohol, polyethylene terephthalate, cellophane, etc.

With the unprocessed plate for dry planographic printing thus prepared, the positive film is subjected to close contact with the plate with the use of an ordinary vacuum frame for the planographic printing plate, and actinic radiation is projected through said film to the plate. After removal of the protective film (if present) the silicone rubber layer in the image area is rubbed off selectively by lightly rubbing the plate surface by a soft pad of non-woven fabric or the like, and the photoadhesive layer in the image areas is bared. If necessary, the image areas may be dyed as disclosed in Japanese Laid Open Patent Application No. 54-103103, for example.

By the action of the developer according to the present invention, it is possible to obtain a printing plate having excellent dot reproduction and less scratches and faults than heretofore, and this can be done in a shorter development time than in conventional methods.

The following Examples are provided for the purpose of further illustrating particular aspects of the present invention, without any intention of limiting the scope of the invention, which is defined in the appended claims.

EXAMPLES

On base substrates of aluminum, photoadhesive layers 4 microns in thickness, each having the following compositions, were provided.
(a) Polyurethane of polyester polyol of adipic acid and hexane-1, 6-diol, 2,2-dimethyl propane-1, 3-diol, and isophorone-di-isocyanate—56 parts by weight.
(b) Addition product of 4 mols of glycidyl methacrylate with 1 mol of xylylene diamine—40 parts by weight
(c) Michler's ketone—4 parts by weight.

The surface of the photoadhesive layer was overcoated with a 10% n-hexane solution of the following silicone gum composition to provide a silicone rubber layer 3μ thick after drying and curing at 50° C.
(a) Dimethylpolysiloxane (molecular weight about 80,000—100 parts by weight.
(b) Methyltriacetoxysilane—5 parts by weight.
(c) Dibutyl tin diacetate—2 parts by weight.

On the plates prepared in the above described manner, polyethylene terephthalate film "Lumilar" (manufactured by Toray Industries, Inc.) of 10 microns in thickness was laminated as a protective film so as to provide unprocessed dry planographic printing plates.

Subsequently, a positive film representing a multiplicity of dots, and having the percentage of dots altered stepwise (2% to 98%, 200 lines per inch) was caused to closely contact each above unprocessed dry planographic printing plate, and each plate was subjected to exposure through the film for 90 seconds by a high pressure mercury lamp (ORC Jet Light 300) from a distance of 1 m.

Thereafter, the protective film of each exposed plate was peeled off, and each of the exposed plates was developed by developers as shown in Table 1 to obtain dry planographic printing plates. The time required for development of the printing plates by those developers, and results expressed dot reproducibility of each of the printing plates were obtained and are tabulated in Table 1.

TABLE 1

| No. | Compositions | Weight Percentage (%) | Time required for developing plate of A 1 size | Dot Reproducibility (200 lines, (2%~98%) |
|---|---|---|---|---|
| 1 | n-Hexane | 100 | 20 min. | 6%~98% |
| 2 | n-Hexane | 98 | | |
| | Polypropylene glycol (average molecular weight 200) | 2 | 5 min. | 2%~98% |
| 3 | n-Hexane | 92 | | |
| | Polypropylene glycol (average molecular weight 400) | 8 | 5 min. | 2%~98% |
| 4 | Polypropylene glycol (average molecular weight 400) | 100 | 10 min. | 2%~98% |
| 5 | n-Hexane | 90 | 5 min. | 2%~98% |

TABLE 1-continued

| No. | Compositions | Weight Percentage (%) | Time required for developing plate of A 1 size | Dot Reproducibility (200 lines, (2%~98%) |
|---|---|---|---|---|
| | Dipropylene glycol monomethyl ether | 10 | | |
| 6 | n-Hexane | 90 | 5 min. | 2%~98% |
| | Tripropylene glycol monomethyl ether | 10 | | |
| 7 | n-Hexane | 90 | 5 min. | 2%~98% |
| | Polypropylene glycol (average molecular weight 400) | 5 | | |
| | Dibutyl adipate | 5 | | |
| 8 | n-Hexane | 85 | 5 min. | 2%~98% |
| | Polypropylene glycol (average molecular weight 400) | 10 | | |
| | 2,3,5-trimethyl-hexanol | 5 | | |
| 9 | n-Hexane | 70 | 5 min. | 2%~98% |
| | Polypropylene oxide-ethylene oxide-monostearyl ether (average molecular weight 1600) | 15 | | |
| | Diethylene glycol monobutyl ether | 15 | | |
| 10 | n-Hexane | 93 | 5 min. | 2%~98% |
| | Propylene oxide addition product of glycerine (average molecular weight 400) | 7 | | |
| 11 | n-Hexane | 95 | 10 min. | 4%~98% |
| | Diethylene glycol monoethyl ether | 5 | | |
| 12 | n-Hexane | 90 | Dissolving a photoadhesive layer. | |
| | Diethylene glycol monoethyl ether | 10 | | |

Upon employment of the No. 2 to No. 10 developers containing the propylene oxide derivative, the silicone rubber layer in the image areas was easily broken off selectively without practically affecting or dissolving the unhardened photoadhesive layer, with the dot producibility in the range of 2 to 98% in each case. For comparison, when the developers No. 1 and No. 11 did not contain the propylene oxide derivative, development time was prolonged and dot producibility was insufficient, although it was possible to break off selectively the silicone rubber layer in the image areas without practically affecting and dissolving the unhardened photoadhesive layer. Furthermore, in developer No. 12, the photoadhesive layer was undesirably dissolved, clearly establishing that developer No. 12 was unsuitable.

We claim:

1. In a method for processing a presensitized positive acting dry planographic printing plate having an ink-repelling silicone rubber layer overlying a photoadhesive layer on a base substrate, the improvement which comprises exposing the plate to actinic light through a positive transparency and removing the silicone rubber layer to bare the photoadhesive layer only in unexposed areas with a developer containing at least about 0.1% by weight of a propylene oxide derivative represented by the formula:

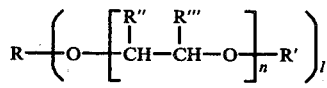

wherein n is a whole number in the range of 1 to 50 l is a whole number in the range of 1 to 8, R is a member selected from the group consisting of hydrogen, mono- or multi-valent alkyl groups having carbon atoms in the range of 1 to 20, mono- or multi-valent aryl or aralkyl groups having 6 to 20 carbon atoms, and acyl groups having 1 to 20, R' is a monovalent group selected from the group consisting of hydrogen, alkyl groups having carbon atoms in the range of 1 to 20, aryl or aralkyl groups having 6 to 20 carbon atoms and acyl groups having 1 to 20, and R'' and R''' are different groups selected from the group consisting of hydrogen and methyl, said photoadhesive layer containing an ethylenically unsaturated monomer or oligomer having the property to polymerize and bond the overlaying silicone rubber layer when exposed to actinic light.

2. The method defined in claim 1, wherein the developer contains at least 1% by weight of the propylene oxide derivative.

3. The method defined in claim 1, wherein the propylene oxide derivative is polypropylene glycol.

4. The method defined in claim 1, wherein the propylene oxide derivative is represented by the formula:

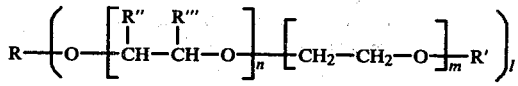

wherein m is an integer of 1 to 25 and has a maximum value of one-half of n and l, n, R, R', R'', R''' are as hereinbefore described.

5. The method defined in claim 4, wherein the developer contains at least 1% by weight of the propylene oxide derivative.

6. The method according to claim 1, wherein said photoadhesive layer comprises:
(1) at least one kind of photopolymerizable ethylenically unsaturated monomer or oligomer having a boiling point above 100° C. in an amount of 1.0–99.9 parts by weight;
(2) a photoinitiator in an amount of 0.1–20.0 parts by weight;
(3) a heat polymerization inhibitor, in an amount of 0.1–10 parts by weight, and
(4) a filler for maintaining the dimensional stability of said photoadhesive layer in an amount of 0.01–95.0 parts by weight.

* * * * *